US010763212B1

(12) United States Patent
Hsieh et al.

(10) Patent No.: US 10,763,212 B1
(45) Date of Patent: Sep. 1, 2020

(54) SEMICONDUCTOR STRUCTURE (71) Applicant: NANYA TECHNOLOGY CORPORATION, New Taipei (TW)

(72) Inventors: Cheng-Hsien Hsieh, New Taipei (TW); Ching-Chia Huang, Taipei (TW); Chen-Lun Ting, Taipei (TW); Tseng-Fu Lu, New Taipei (TW); Wei-Ming Liao, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/388,314

(22) Filed: Apr. 18, 2019

(51) Int. Cl.
H01L 23/532 (2006.01)
H01L 27/108 (2006.01)
H01L 23/528 (2006.01)

(52) U.S. Cl.
CPC ...... H01L 23/53295 (2013.01); H01L 23/528 (2013.01); H01L 23/53257 (2013.01); H01L 27/10808 (2013.01); H01L 27/10873 (2013.01); H01L 27/10885 (2013.01)

(58) Field of Classification Search
CPC ......... H01L 23/53295; H01L 27/10873; H01L 23/53257; H01L 23/528; H01L 27/10808; H01L 27/10885
See application file for complete search history.

(56) References Cited

U.S. PATENT DOCUMENTS 6,492,245 B1 * 12/2002 Liu ............... H01L 21/764 438/422
2016/0005749 A1 * 1/2016 Li ............... G11C 11/223 257/295

* cited by examiner

Primary Examiner — Edward Chin
(74) Attorney, Agent, or Firm — Muncy, Geissler, Olds & Lowe, P.C.

(57) ABSTRACT

A semiconductor structure includes a substrate including a surface, a first doped region and a second doped region, wherein the first doped region and the second doped region are disposed under the surface; a gate structure disposed between the first doped region and the second doped region; a capacitor disposed over and electrically connected to the first doped region; and a bit line disposed over and electrically connected to the second doped region, wherein the bit line includes a conductive portion and an insulating portion surrounding the conductive portion, and the insulating portion includes ferroelectric material.

19 Claims, 13 Drawing Sheets

SEMICONDUCTOR STRUCTURE

TECHNICAL FIELD

The present disclosure relates to a semiconductor structure, and particularly relates to a bit line structure in a memory cell.

DISCUSSION OF THE BACKGROUND

Semiconductor devices are essential for many modern applications. Among the semiconductor devices, memory devices such as dynamic random access memory (DRAM) devices have assumed an important role. The memory device includes several memory cells arranged in rows and columns over a substrate, wherein information of each memory cell is stored by a capacitor and is accessible by a bit line extending over a surface of the substrate.

With the advancement of electronic technology, capacity of the memory device continues to increase. In other words, a density of the memory cells arranged over the substrate is increased, and a size of each memory cell is decreased. As a result, a parasitic capacitance exists between components in the memory cell. The parasitic capacitance adversely affects a performance of the memory device.

Therefore, there is a continuous need to improve a structural configuration of the semiconductor device.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure comprising a substrate including a surface, a first doped region and a second doped region, wherein the first and second doped regions are disposed under the surface; a gate structure disposed between the first doped region and the second doped region; a capacitor disposed over and electrically connected to the first doped region; and a bit line disposed over and electrically connected to the second doped region, wherein the bit line includes a conductive portion and an insulating portion surrounding the conductive portion, and the insulating portion includes ferroelectric material.

In some embodiments, the ferroelectric material is in contact with the conductive portion.

In some embodiments, the conductive portion extends in parallel to the insulating portion.

In some embodiments, the insulating portion further includes a void and a nitride layer surrounding the conductive portion.

In some embodiments, the ferroelectric material is disposed over the void and the nitride layer.

In some embodiments, the void is surrounded by the nitride layer.

In some embodiments, the conductive portion is entirely surrounded by the ferroelectric material.

In some embodiments, the insulating portion is disposed between the capacitor and the conductive portion.

In some embodiments, a distance between the capacitor and the bit line is about 10 nm.

In some embodiments, the capacitor is electrically connected to and accessible through the bit line.

In some embodiments, the ferroelectric material includes lead zirconate titanate ($PbZr/TiO_3$), barium titanate ($BaTiO_3$) or lead titanate ($PbTiO_3$).

In some embodiments, the conductive portion includes titanium (Ti) or tungsten (W).

In some embodiments, the semiconductor structure further includes a dielectric layer disposed over the substrate and surrounding the gate structure, the capacitor and the bit line.

Another aspect of the present disclosure provides a semiconductor structure comprising a substrate including a surface, a first doped region and a second doped region, wherein the first and second doped regions are disposed under the surface; a transistor disposed between the first doped region and the second doped region; a word line disposed over and electrically connected to the transistor; a capacitor disposed over and electrically connected to the first doped region; and a bit line disposed over and electrically connected to the second doped region, wherein the bit line includes ferroelectric material.

In some embodiments, the ferroelectric material is disposed at a periphery of the bit line.

In some embodiments, a distance between the ferroelectric material and the capacitor is about 10 nm.

In some embodiments, the bit line further includes a conductive material surrounded by the ferroelectric material.

In some embodiments, a width of the conductive material is substantially greater than a width of the ferroelectric material.

In some embodiments, the semiconductor structure further includes a first dielectric layer disposed over the substrate and surrounding the transistor, and a second dielectric layer disposed over the first dielectric layer and surrounding the word line, the capacitor and the bit line.

In some embodiments, the ferroelectric material extends through the first dielectric layer or the second dielectric layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

In a memory device, several memory cells are arranged in rows and columns, wherein each memory cell is configured to store a bit of information. The memory cell includes a transistor configured to control a storage operation. The transistor is controlled by a word line. The memory cell also includes a capacitor configured for storage. The capacitor is accessible through a bit line. The bit line and the word line extend over a surface of a substrate.

With ongoing technological advancement, functionality and capacity of the memory devices is increased, while overall sizes of the memory devices continue to become smaller and smaller. Thus, a parasitic capacitance between the capacitor and the bit line becomes significant, which is undesirable. For example, an operational speed of the memory device is decreased. As a result, overall performance of the memory device is adversely affected.

In the present disclosure, a semiconductor structure is disclosed. The semiconductor structure includes a substrate including a surface, a first doped region and a second doped region, wherein the first and second doped regions are disposed under the surface; a gate structure disposed between the first doped region and the second doped region; a capacitor disposed over and electrically connected to the first doped region; and a bit line disposed over and electrically connected to the second doped region, wherein the bit line includes a conductive portion and an insulating portion surrounding the conductive portion, and the insulating portion includes ferroelectric material. The bit line includes ferroelectric material which can have a transient negative capacitance. Accordingly, an undesirable parasitic capacitance between the capacitor and the bit line can be reduced.

Figure 1:
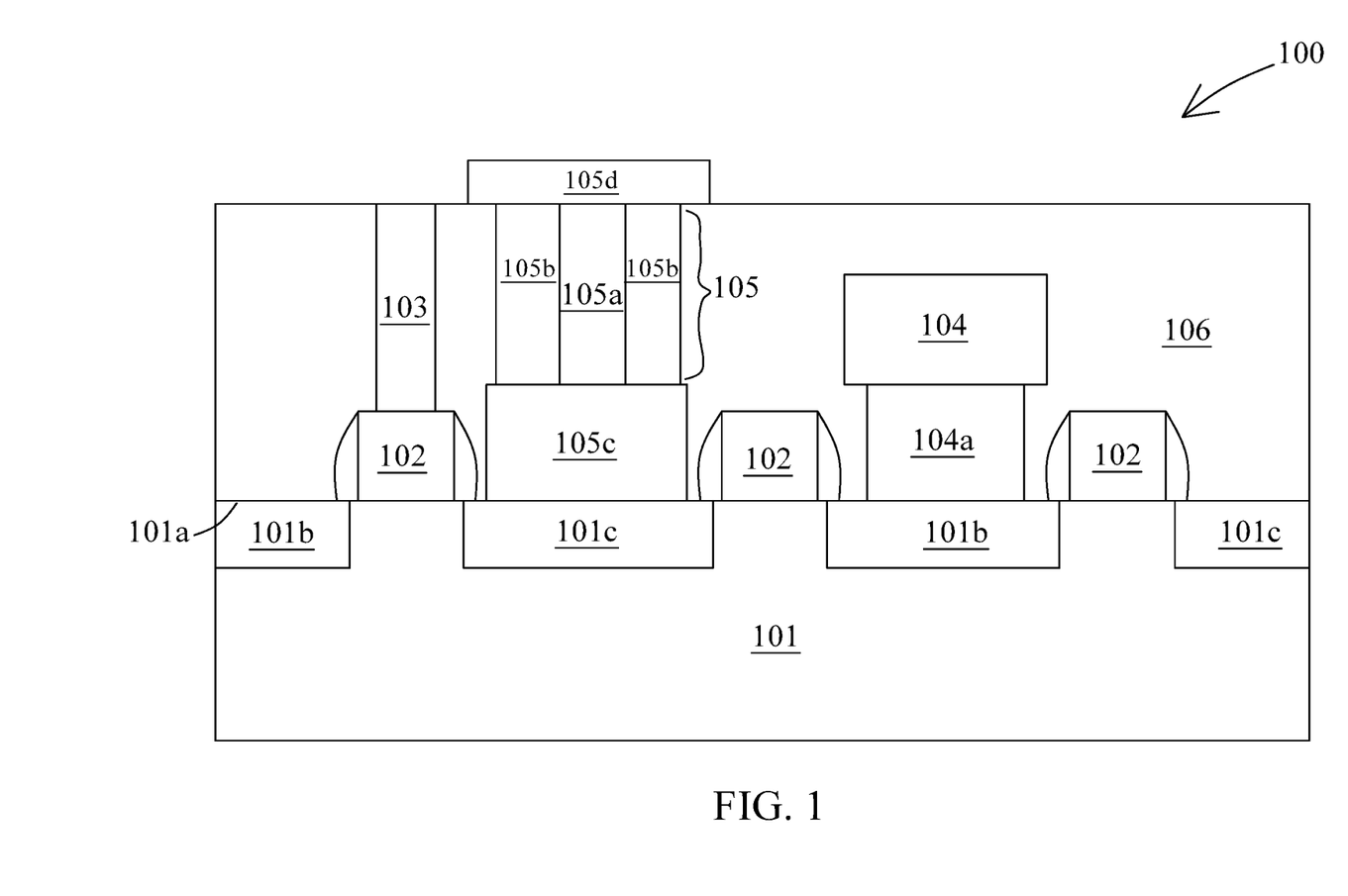
FIG. 1 is a schematic cross-sectional view of a semiconductor structure in accordance with some embodiments of the present disclosure.

FIG. 1 is a schematic cross-sectional view of a semiconductor structure 100 in accordance with some embodiments of the present disclosure. In some embodiments, the semiconductor structure 100 is a part of a memory device. In some embodiments, the semiconductor structure 100 is a part of a memory cell, and several memory cells are arranged in the memory device. In some embodiments, the memory device is a dynamic random access memory (DRAM) device.

In some embodiments, the semiconductor structure 100 includes a substrate 101. In some embodiments, the substrate 101 is a semiconductive substrate. In some embodiments, the substrate 101 includes semiconductive material such as silicon, germanium, gallium, arsenic, or combinations thereof. In some embodiments, the substrate 101 is a silicon substrate. In some embodiments, the substrate 101 includes material such as ceramic, glass or the like. In some embodiments, the substrate 101 is a silicon on insulator (SOI) substrate, wherein an insulation layer is disposed over a silicon substrate. In some embodiments, the substrate 101 is fabricated with a predetermined functional circuit thereon.

In some embodiments, the substrate 101 includes a surface 101a. In some embodiments, several active regions are defined and disposed over or in the substrate 101. In some embodiments, the active region is disposed over or proximal to the surface 101a of the substrate 101. In some embodiments, the active region includes several doped regions 101b, 101c. In some embodiments, each of the doped regions 101b, 101c includes the same type of dopants. In some embodiments, each of the doped regions 101b, 101c includes a type of dopant that is different from the type of dopant included in the other doped region 101b, 101c.

In some embodiments, the doped regions 101b, 101c include a first doped region 101b and a second doped region 101c. In some embodiments, the first doped region 101b and the second doped region 101c are disposed over or under the surface 101a of the substrate 101. In some embodiments, the first doped region 101b and the second doped region 101c include dopants of the same type. In some embodiments, the first doped region 101b and the second doped region 101c include N type dopants. In some embodiments, the first doped region 101b and the second doped region 101c are of the same conductive type.

In some embodiments, the gate structure 102 is disposed between the first doped region 101b and the second doped region 101c. In some embodiments, the gate structure 102 is a transistor configured to control accessibility of a capacitor 104 (as discussed further below). In some embodiments, a word line 103 is disposed over and electrically connected to the gate structure 102, such that the gate structure 102 is controlled by the word line 103. In some embodiments, the word line 103 includes a plug portion extending toward and contacting the gate structure 102, and a line portion extending over the substrate 101.

In some embodiments, the gate structure 102 includes a gate dielectric, a gate electrode disposed over the gate dielectric, and a gate spacer surrounding the gate dielectric and the gate electrode. In some embodiments, the gate dielectric is a gate oxide including oxide, silicon oxide, high dielectric constant (high-k) oxide, or the like. In some embodiments, the gate electrode is a metal electrode including polysilicon, tungsten, or the like. In some embodiments, the gate spacer is an insulator including nitride, low-k dielectric, or the like.

In some embodiments, the capacitor 104 is disposed over and electrically connected to the first doped region 101b. In some embodiments, the capacitor 104 is a storage capacitor configured to store information in a bit format. In some embodiments, a signal is transmitted through the word line 103 to the gate structure 102, such that the capacitor 104 can be accessed. In some embodiments, the capacitor 104 can be accessed through a bit line 105 (as discussed further below). In some embodiments, the capacitor 104 is electrically connected to and accessible through the bit line 105.

In some embodiments, the capacitor 104 includes a body portion and an insulating layer surrounding the body portion. In some embodiments, the body portion includes polysilicon or any other suitable material, and the insulating layer includes nitride, oxide, or the like. In some embodiments, the insulating layer is a nitride-oxide (NO) layer or an oxide-nitride-oxide (NON) layer.

In some embodiments, a first conductive plug 104a is disposed between the capacitor 104 and the first doped region 101b, and electrically connects the capacitor 104 to the first doped region 101b. In some embodiments, the first conductive plug 104a includes conductive material such as copper, aluminum, tungsten, or the like.

In some embodiments, the bit line 105 is disposed over and electrically connected to the second doped region 101c. In some embodiments, the capacitor 104 can be accessed through the bit line 105 if the gate structure 102 is allowed to access the capacitor 104 by the word line 103. In some embodiments, a signal is transmitted to the bit line 105, such that the information stored in the capacitor 104 can be read or information can be written and stored in the capacitor 104.

In some embodiments, at least a portion of the bit line 105 includes ferroelectric material. In some embodiments, the bit line 105 includes a conductive portion 105a and an insulating portion 105b surrounding the conductive portion 105a. In some embodiments, the conductive portion 105a extends in parallel to the insulating portion 105b. In some embodiments, the conductive portion 105a is at least partially in contact with the insulating portion 105b. In some embodiments, the conductive portion 105a is entirely surrounded by the insulating portion 105b. In some embodiments, the ferroelectric material is disposed at a periphery of the bit line 105. In some embodiments, a width of the conductive portion 105a is substantially greater than a width of the insulating portion 105b.

In some embodiments, the conductive portion 105a includes titanium (Ti), tungsten (W) or any other suitable material. In some embodiments, the insulating portion 105b includes ferroelectric material such as lead zirconate titanate ($PbZr/TiO_3$), barium titanate ($BaTiO_3$) or lead titanate ($PbTiO_3$). In some embodiments, the insulating portion 105b includes material having transient negative capacitance (NC).

In some embodiments, the ferroelectric material is in contact with the conductive portion 105a. In some embodiments, the conductive portion 105a is entirely surrounded by the ferroelectric material. In some embodiments, the bit line 105 is disposed adjacent to the capacitor 104. In some embodiments, the insulating portion 105b is disposed between the capacitor 104 and the conductive portion 105a. In some embodiments, the ferroelectric material is disposed between the conductive portion 105a and the capacitor 104.

In some embodiments, a distance between the capacitor 104 and the bit line 105 is about 10 nm.

In some embodiments, a second conductive plug 105c is disposed between the bit line 105 and the second doped region 101c and electrically connects the bit line 105 to the second doped region 101c. In some embodiments, the second conductive plug 105c includes conductive material such as copper, aluminum, tungsten, or the like.

In some embodiments, the bit line 105 includes a line portion 105d extending over the substrate 101 and substantially orthogonal to the conductive portion 105a and the insulating portion 105b. In some embodiments, the bit line 105 is substantially orthogonal to the word line 103. In some embodiments, the bit line 105 is electrically isolated from the word line 103. In some embodiments, the bit line 105 is arranged in a row, and the word line 103 is arranged in a column.

In some embodiments, a dielectric layer 106 is disposed over the substrate 101 and surrounds the gate structure 102, the word line 103, the capacitor 104 and the bit line 105. In some embodiments, the dielectric layer 106 includes several layers of dielectric material stacked over each other. In some embodiments, the dielectric layer 106 includes oxide, silicon oxide, or the like.

In some embodiments, the dielectric layer 106 includes a first dielectric layer disposed over the substrate 101 and surrounding the gate structure 102, and a second dielectric layer disposed over the first dielectric layer and surrounding the word line 103, the capacitor 104 and the bit line 105. In some embodiments, the first conductive plug 104a and the second conductive plug 105c extend through the first dielectric layer.

Figure 2:
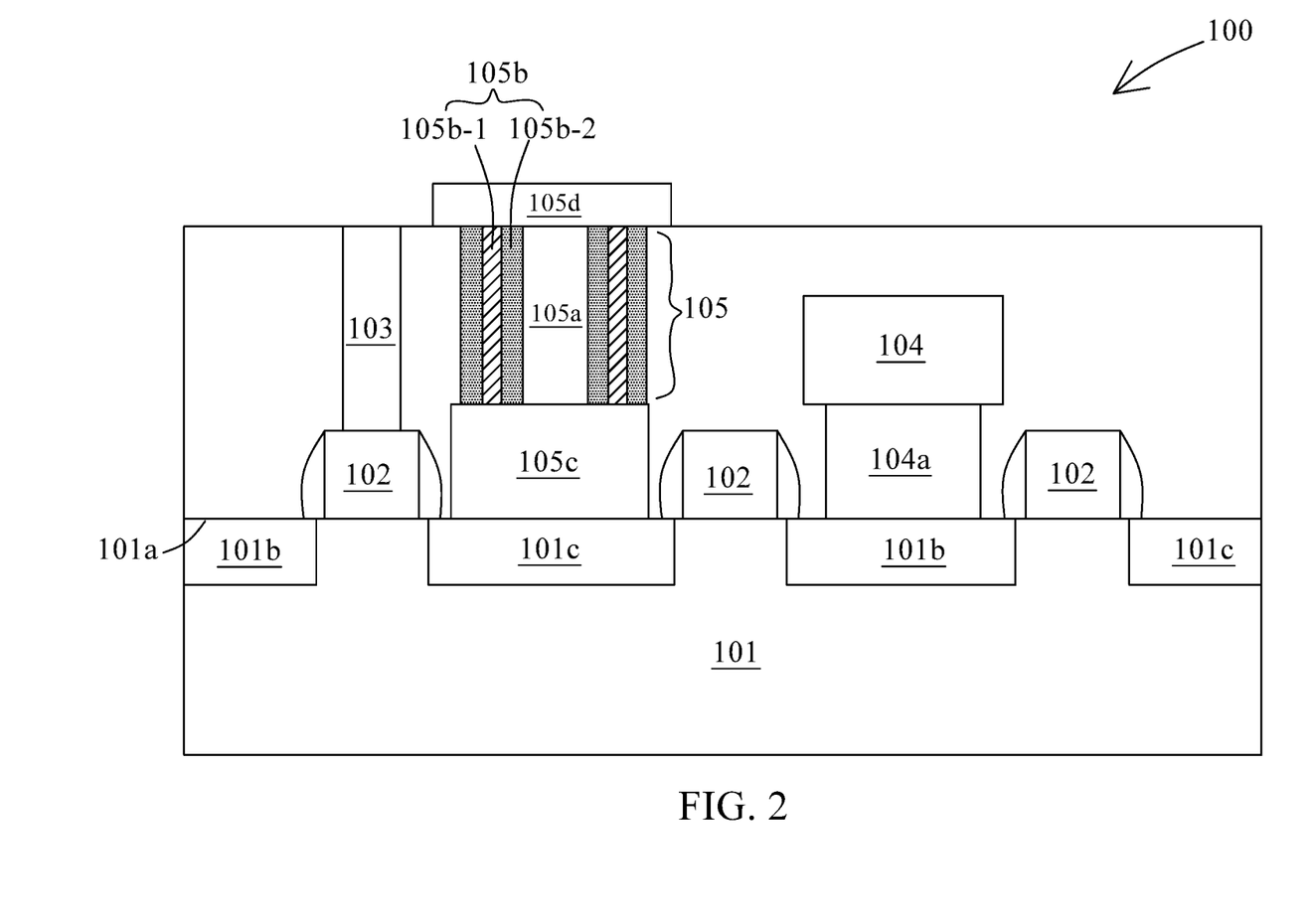
FIG. 2 is a schematic cross-sectional view of the semiconductor structure illustrating another embodiment of a bit line in the semiconductor structure.

FIG. 2 is a schematic cross-sectional view of the semiconductor structure 100 illustrating another embodiment of the bit line 105. In some embodiments, the bit line 105 includes the conductive portion 105a and the insulating portion 105b. In some embodiments, the insulating portion 105b includes the ferroelectric material 105b-1 and a nitride layer 105b-2 surrounding the ferroelectric material 105b-1.

In some embodiments, the ferroelectric material 105b-1 extends in parallel to the nitride layer 105b-2. In some embodiments, the ferroelectric material 105b-1 is entirely surrounded by the nitride layer 105b-2. In some embodiments, the ferroelectric material 105b-1 is disposed at a periphery of the bit line 105. In some embodiments, the ferroelectric material 105b-1 is in contact with the nitride layer 105b-2, but is not in contact with the conductive portion 105a. In some embodiments, the nitride layer 105b-2 includes nitride, silicon nitride or any other suitable material. In some embodiments, a width of the ferroelectric material 105b-1 is substantially greater than or equal to a width of the nitride layer 105b-2.

Figure 3:
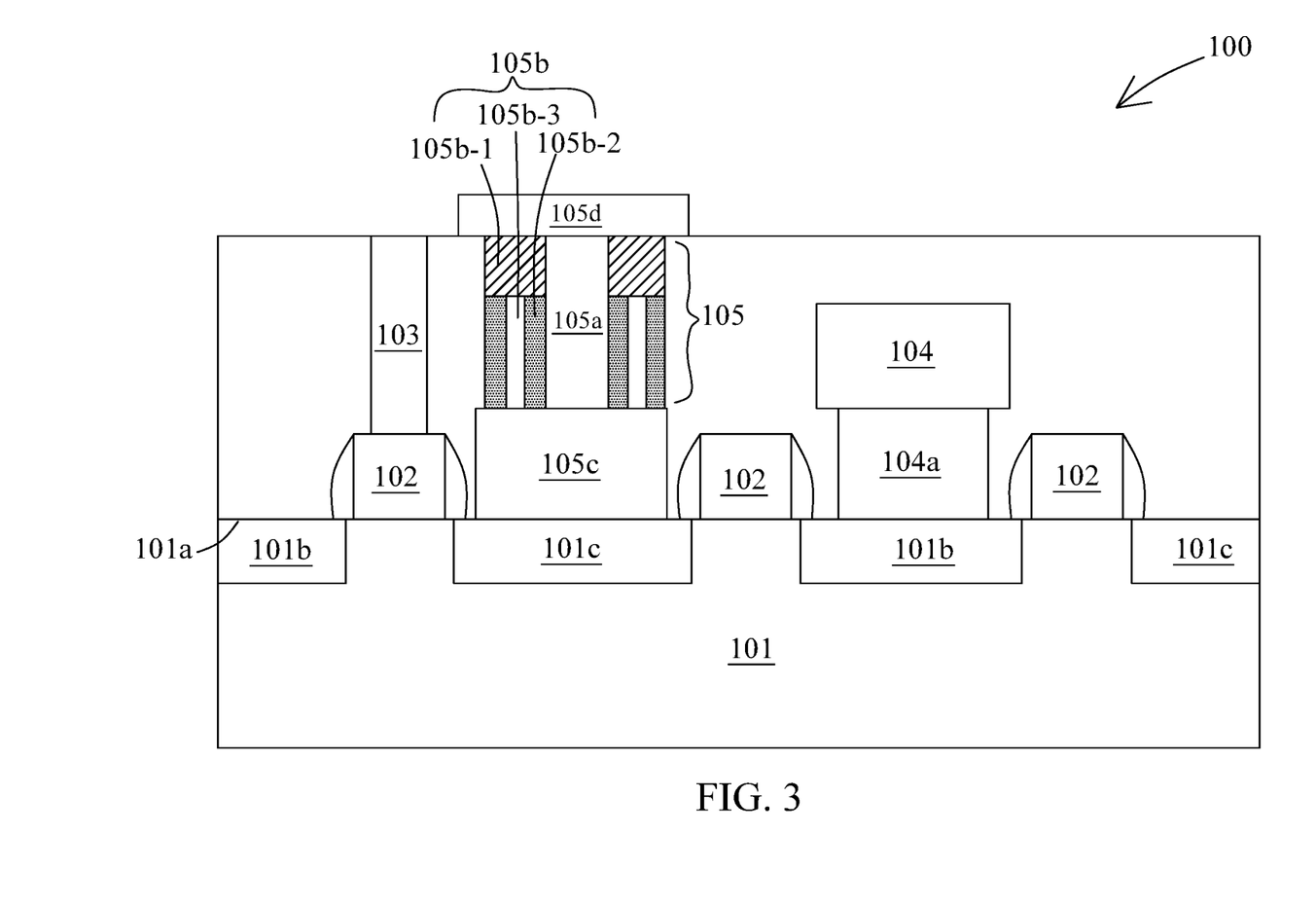
FIG. 3 is a schematic cross-sectional view of the semiconductor structure illustrating another embodiment of a bit line in the semiconductor structure.

FIG. 3 is a schematic cross-sectional view of the semiconductor structure 100 illustrating another embodiment of the bit line 105. In some embodiments, the bit line 105 includes the conductive portion 105a and the insulating portion 105b. In some embodiments, the insulating portion 105b includes the ferroelectric material 105b-1, the nitride layer 105b-2 and a void 105b-3. In some embodiments, the ferroelectric material 105b-1 is disposed at a periphery of the bit line 105. In some embodiments, a distance between the ferroelectric material 105b-1 and the capacitor 104 is about 10 nm. In some embodiments, the conductive portion 105a is surrounded by the ferroelectric material 105b-1, the nitride layer 105b-2 and the void 105b-3. In some embodiments, the void 105b-3 is surrounded by the nitride layer 105b-2, and the ferroelectric material 105b-1 is disposed above the nitride layer 105b-2 and the void 105b-3.

In some embodiments, the ferroelectric material 105b-1 surrounds the conductive portion 105a. In some embodiments, the nitride layer 105b-2 and the void 105b-3 surround the conductive portion 105a. In some embodiments, the void 105b-3 is an air gap with any type of gas in the void 105b-3. In some embodiments, the void 105b-3 is filled by atmospheric air. In some embodiments, solid material is absent in the void 105b-3.

In the present disclosure, a method of manufacturing a semiconductor structure is also disclosed. In some embodiments, a semiconductor structure 100 can be formed as shown in FIGS. 4 to 13. A number of steps, description and illustration as shown in the Figures are not deemed as a limitation to the sequence of the steps.

Figure 4:
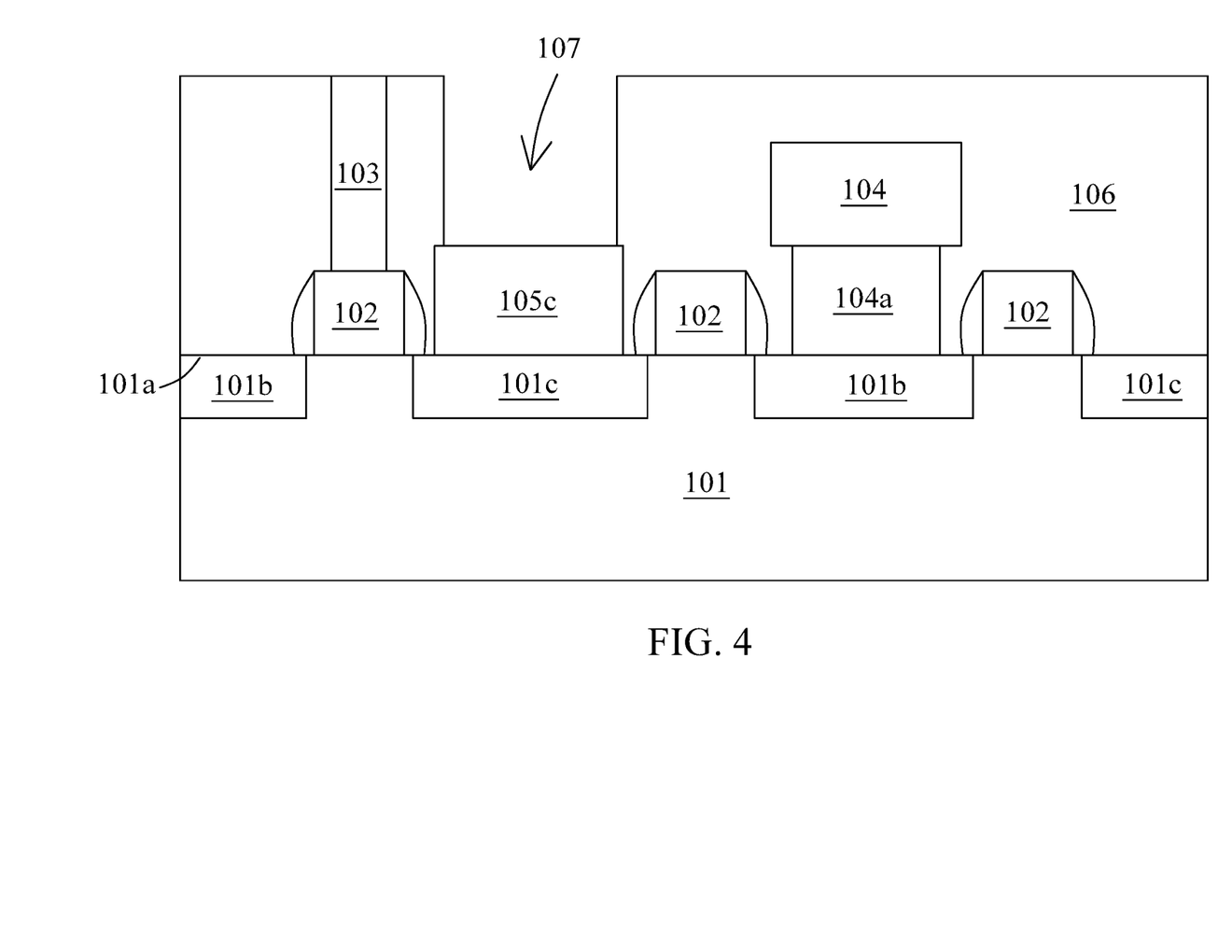
FIGS. 4 to 13 are schematic views illustrating stages of manufacturing a semiconductor structure in accordance with some embodiments of the present disclosure.

A substrate 101, a gate structure 102, a word line 103 and a capacitor 104 are formed and provided as shown in FIG. 4. In some embodiments, the substrate 101, the gate structure 102, the word line 103 and the capacitor 104 are in configurations as described above or as illustrated in FIGS. 1 to 3. In some embodiments, the substrate 101 is provided, and then the gate structure 102, the word line 103 and the capacitor 104 are formed over the substrate 101. In some embodiments, the first doped region 101b and the second doped region 101c of the substrate 101 are formed by implantation or any other suitable operation.

In some embodiments, the gate structure 102 is formed by deposition of the gate dielectric and the gate electrode, such as chemical vapor deposition (CVD), plasma enhanced CVD (PECVD) or any other suitable operation. In some embodiments, the word line 103, the first conductive plug 104a and the second conductive plug 105c are formed by photolithography, etching, electroplating or any other suitable operation.

In some embodiments, a portion of the dielectric layer 106 is removed to form an opening 107 as shown in FIG. 4. In some embodiments, the removal of the portion of the dielectric layer 106 includes etching or any other suitable operation.

Figure 5:
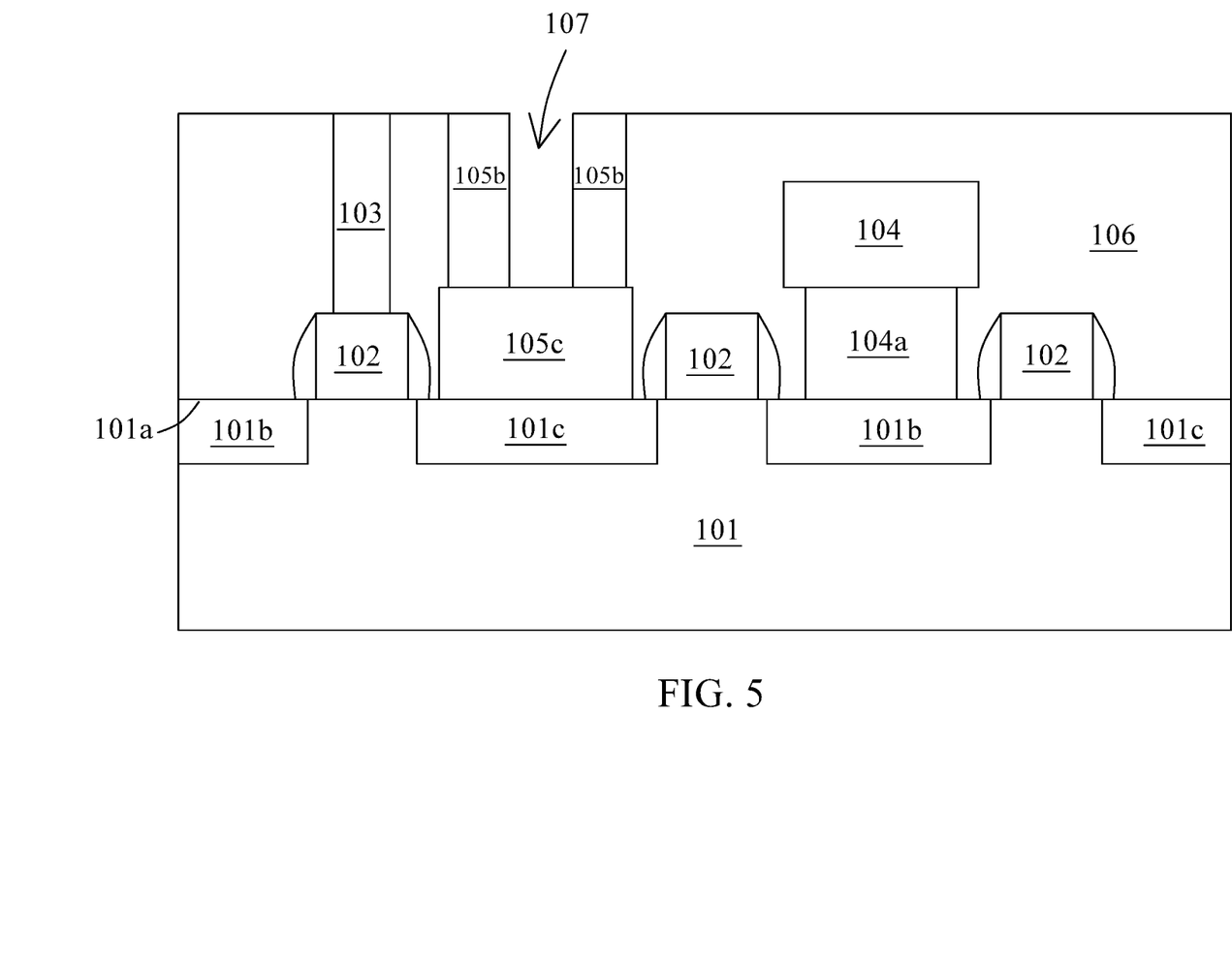
Figure 6:
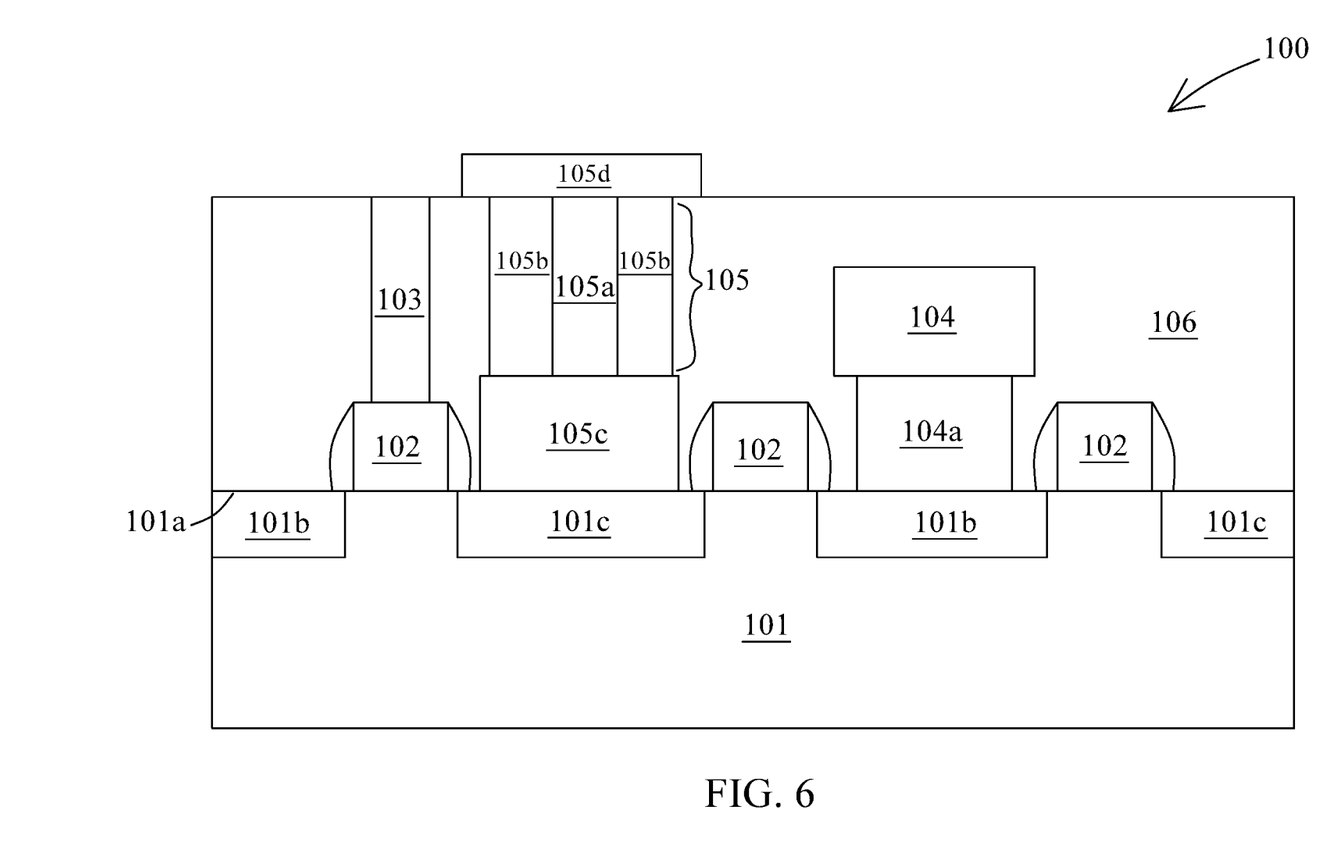

In some embodiments, the bit line 105 is formed by various operations. In some embodiments, the bit line 105 is formed as shown in FIGS. 5 to 6. In some embodiments, the ferroelectric material is disposed along a sidewall of the opening 107 to form the insulating portion 105b of the bit line 105. In some embodiments, the conductive portion 105a is formed by disposing a conductive material within the opening 107, wherein the conductive material is surrounded by the insulating portion 105b. In some embodiments, the conductive portion 105a and the insulating portion 105b are in configurations as described above or as illustrated in FIG. 1. In some embodiments, the ferroelectric material and the conductive material are disposed by electroplating, sputtering or any other suitable operation. In some embodiments, the semiconductor structure 100 as shown in FIG. 1 is formed.

Figure 7:
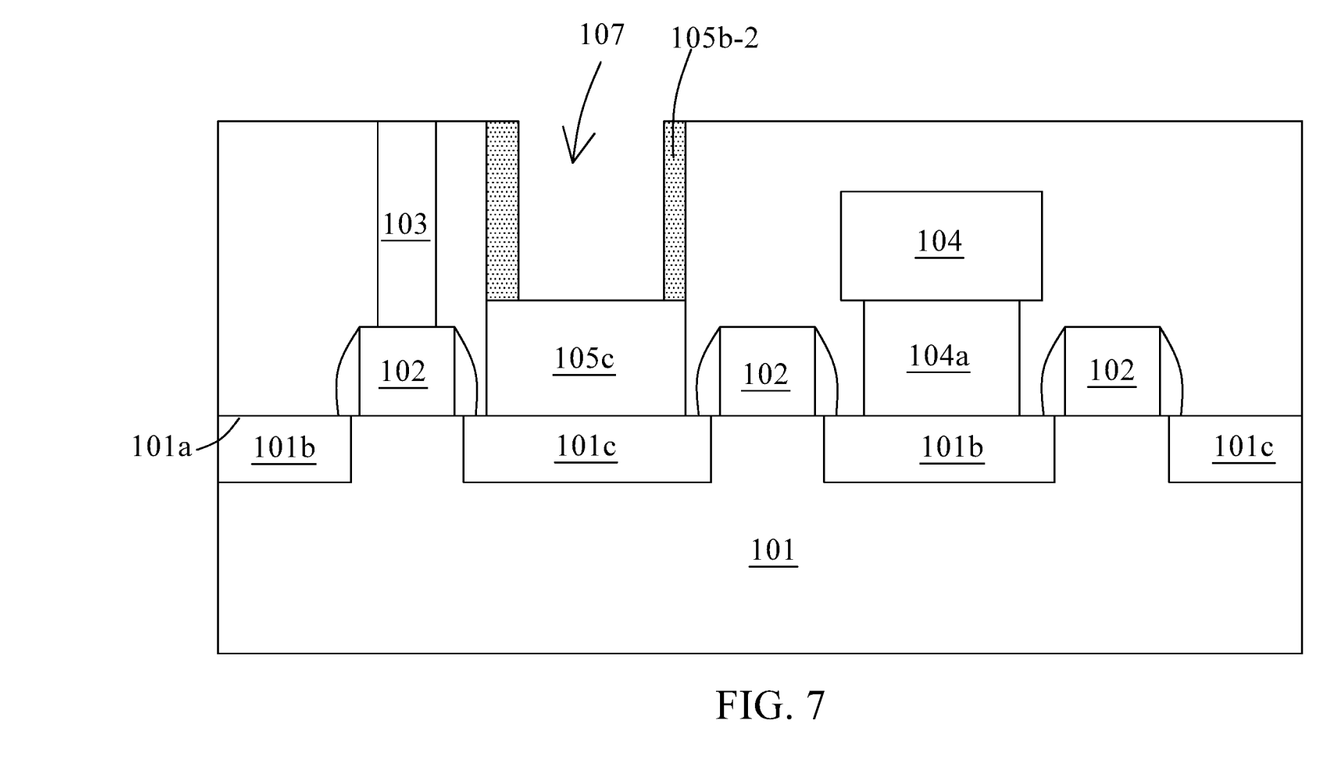
Figure 8:
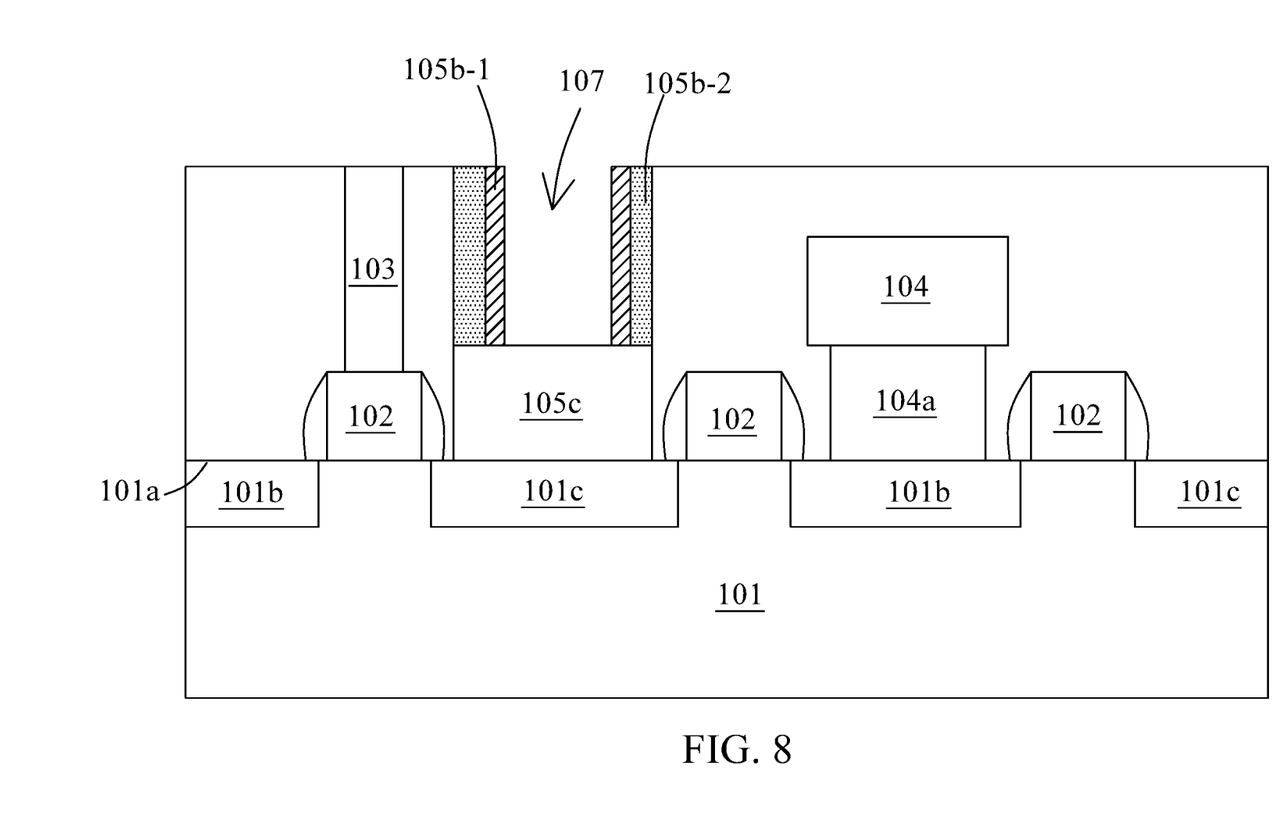
Figure 9:
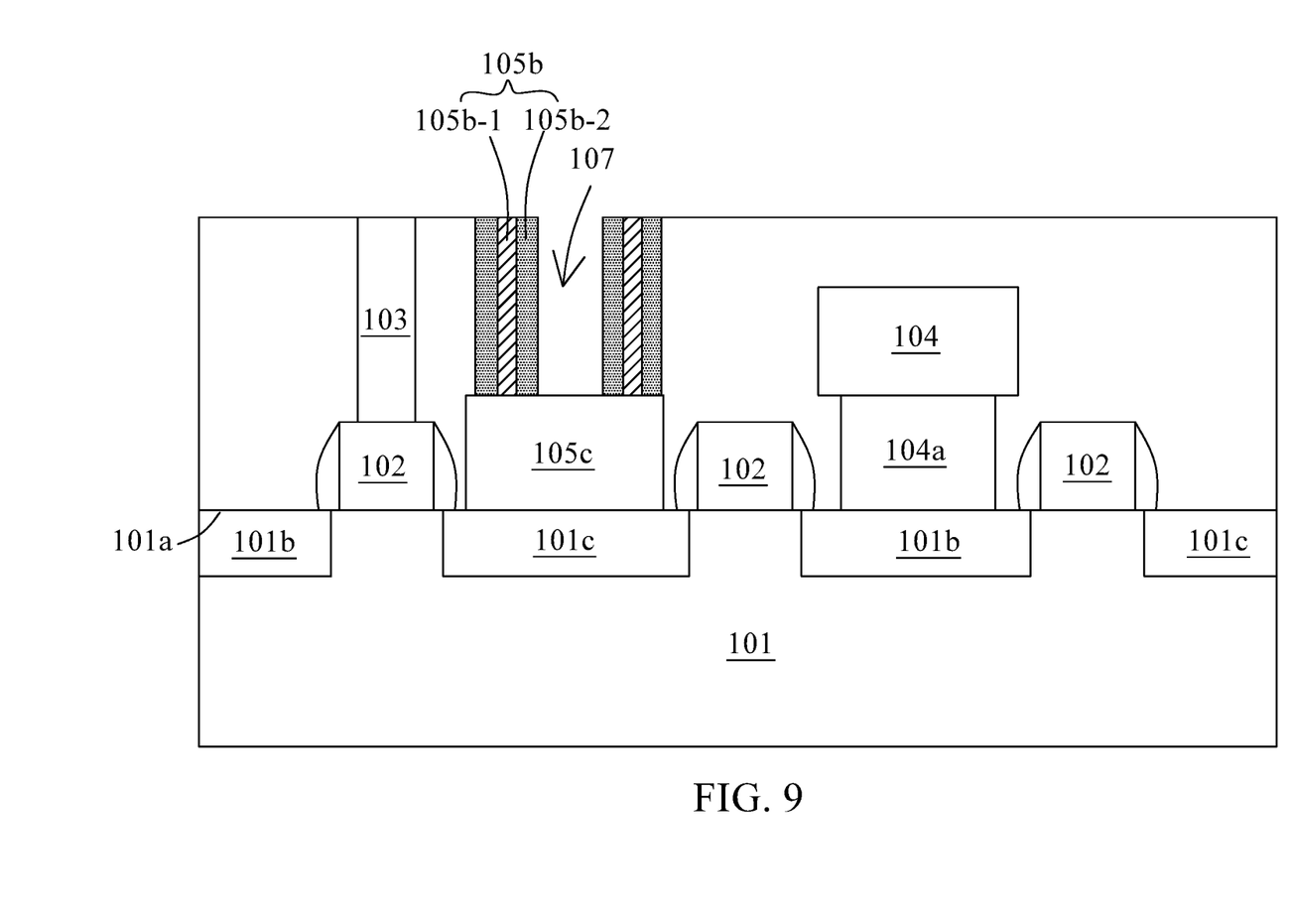

In some embodiments, the bit line 105 is formed as shown in FIGS. 7 to 10. In some embodiments, the nitride layer 105b-2 is disposed along the sidewall of the opening 107 as shown in FIG. 7, and then the ferroelectric material 105b-1 is disposed within the opening 107 and within the nitride layer 105b-2 as shown in FIG. 8. In some embodiments, the nitride layer 105b-2 is disposed by deposition or any other suitable operation. In some embodiments, the nitride layer 105b-2 is further disposed within the opening 107 and surrounded by the ferroelectric material 105b-1 as shown in FIG. 9. In some embodiments, the insulating portion 105b is formed, and is in a configuration as described above or as illustrated in FIG. 2.

Figure 10:
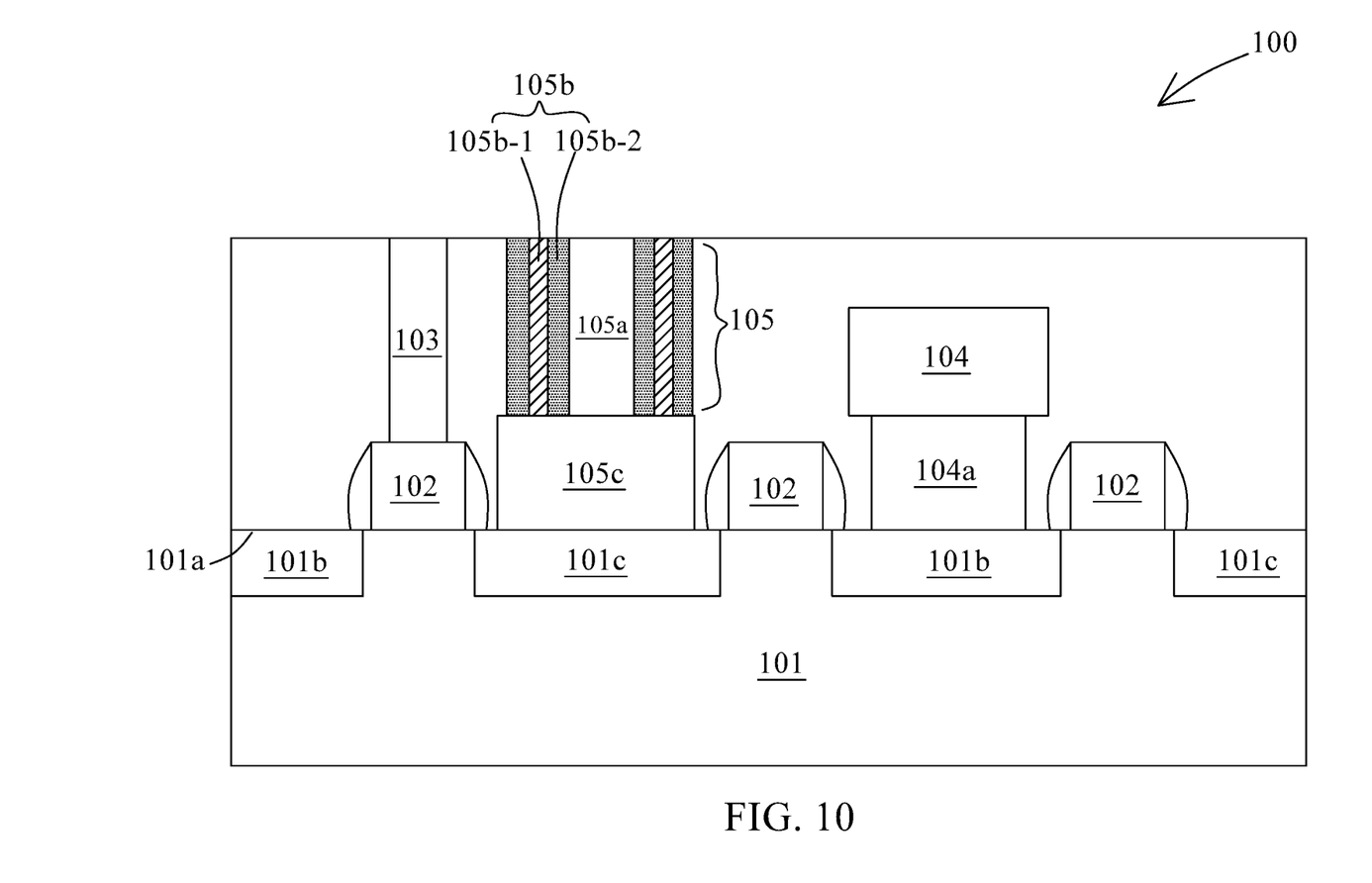

In some embodiments, the conductive portion 105a is formed by disposing a conductive material within the opening 107 and surrounded by the insulating portion 105b as shown in FIG. 10. In some embodiments, the conductive material is surrounded by the nitride layer 105b-2. In some embodiments, the conductive portion 105a is in configurations as described above or as illustrated in FIG. 2. In some embodiments, the conductive material is disposed by electroplating, sputtering or any other suitable operation. In some embodiments, the semiconductor structure 100 as shown in FIG. 2 is formed.

Figure 11:
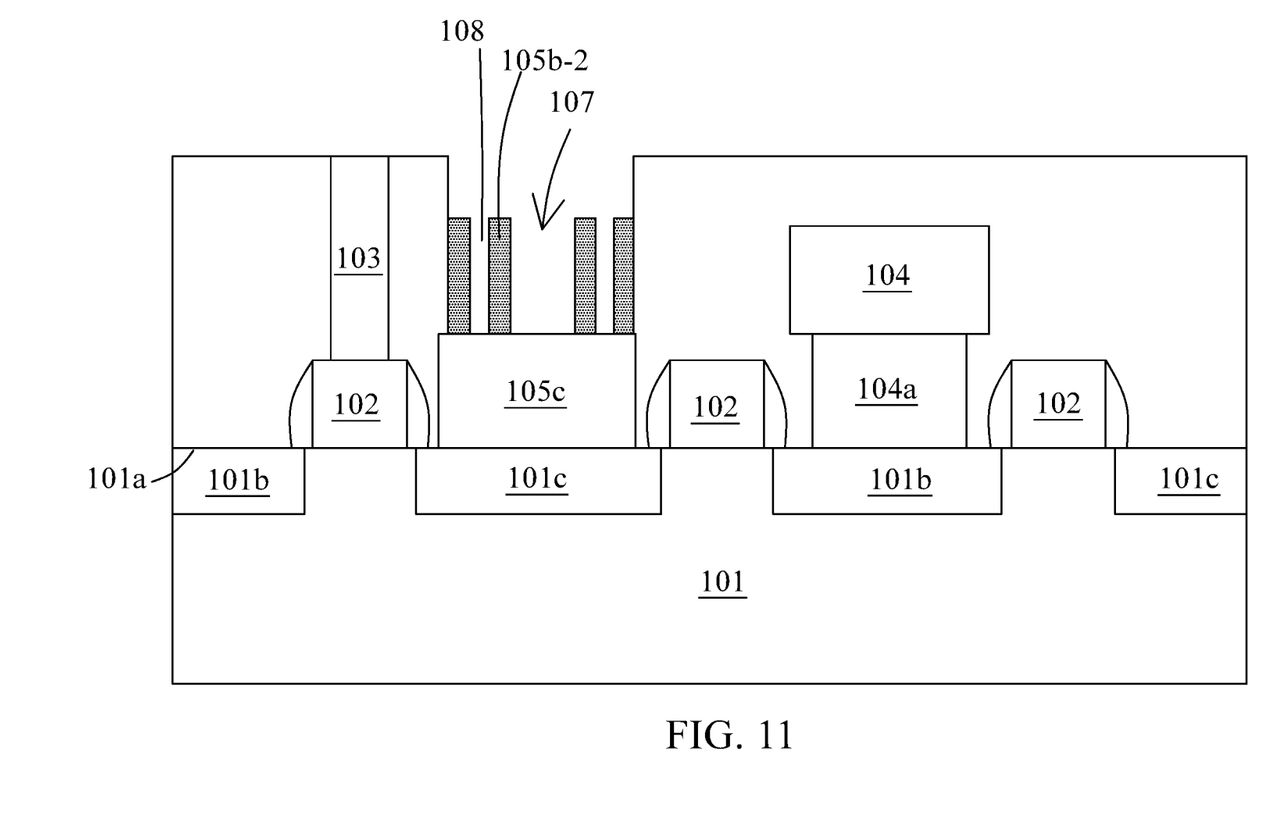
Figure 12:
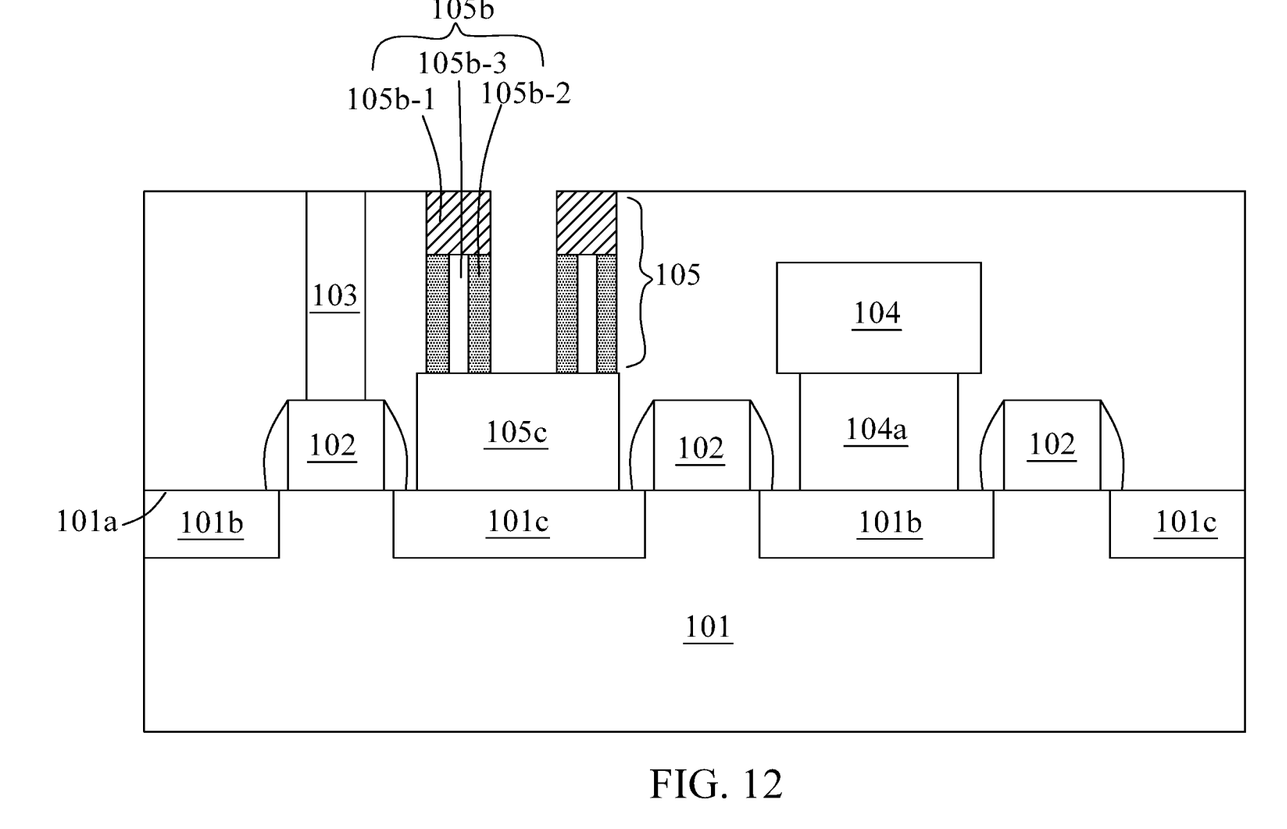
Figure 13:
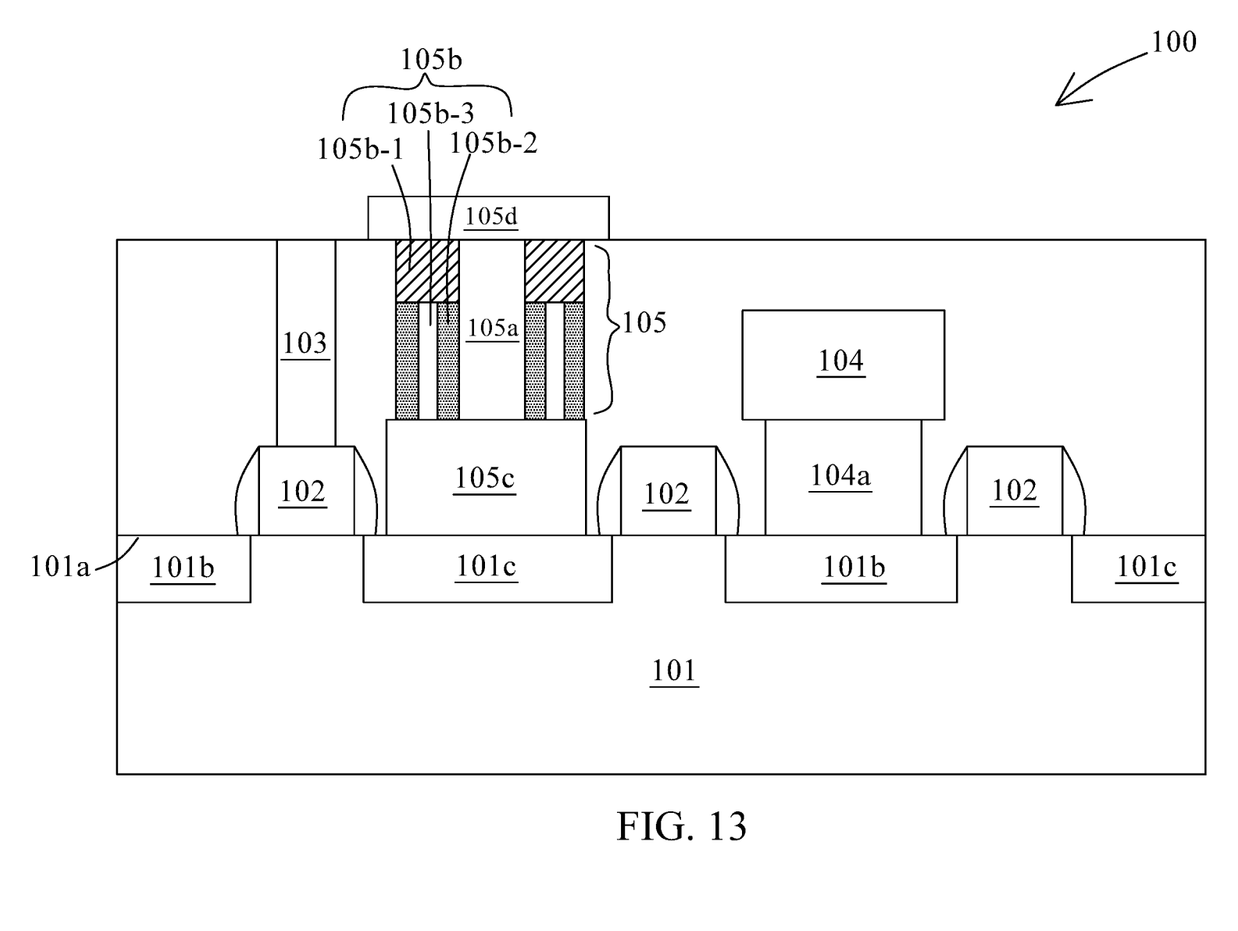

In some embodiments, the bit line 105 is formed as shown in FIGS. 11 to 13. In some embodiments, the nitride layer 105b-2 is disposed within the opening 107, and a portion of the nitride layer 105b-2 is removed, which causes a gap 108 to be formed as shown in FIG. 11. In some embodiments, the ferroelectric material 105b-1 is disposed over the nitride layer 105b-2 and the gap 108, and the void 105b-3 is formed as shown in FIG. 12. In some embodiments, the ferroelectric material 105b-1 seals the gap 108 to form the void 105b-3. In some embodiments, the ferroelectric material 105b-1, the nitride layer 105b-2 and the void 105b-3 are in configurations as described above or as illustrated in FIG. 3.

In some embodiments, the conductive portion 105a is formed by disposing a conductive material within the opening 107 and surrounded by the insulating portion 105b as shown in FIG. 13. In some embodiments, the conductive material is surrounded by the ferroelectric material 105b-1, the nitride layer 105b-2 and the void 105b-3. In some embodiments, a line portion 105d is formed to cover the conductive portion 105a and the insulating portion 105b. In some embodiments, the semiconductor structure 100 as shown in FIG. 3 is formed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
    a substrate including a surface, a first doped region and a second doped region, wherein the first doped region and the second doped region are disposed under the surface;
    a gate structure disposed between the first doped region and the second doped region;

a capacitor disposed over and electrically connected to the first doped region; and a bit line disposed over and electrically connected to the second doped region, wherein the bit line includes a conductive portion and an insulating portion surrounding the conductive portion, and the insulating portion includes ferroelectric material;

wherein the insulating portion further includes a void and a nitride layer surrounding the conductive portion.

2. The semiconductor structure of claim 1, wherein the ferroelectric material is in contact with the conductive portion.

3. The semiconductor structure of claim 1, wherein the conductive portion extends in parallel to the insulating portion.

4. The semiconductor structure of claim 1, wherein the ferroelectric material is disposed over the void and the nitride layer.

5. The semiconductor structure of claim 1, wherein the void is surrounded by the nitride layer.

6. The semiconductor structure of claim 1, wherein the conductive portion is entirely surrounded by the ferroelectric material.

7. The semiconductor structure of claim 1, wherein the insulating portion is disposed between the capacitor and the conductive portion.

8. The semiconductor structure of claim 1, wherein a distance between the capacitor and the bit line is about 10 nm.

9. The semiconductor structure of claim 1, wherein the capacitor is electrically connected to and accessible through the bit line.

10. The semiconductor structure of claim 1, wherein the ferroelectric material includes lead zirconate titanate (PbZr/TiO$_3$), barium titanate (BaTiO$_3$) or lead titanate (PbTiO$_3$).

11. The semiconductor structure of claim 1, wherein the conductive portion includes titanium (Ti) or tungsten (W).

12. The semiconductor structure of claim 1, further comprising a dielectric layer disposed over the substrate and surrounding the gate structure, the capacitor and the bit line.

13. A semiconductor structure, comprising:

a substrate including a surface, a first doped region and a second doped region, wherein the first doped region and the second doped region are disposed under the surface;

a transistor disposed between the first doped region and the second doped region;

a word line disposed over and electrically connected to the transistor;

a capacitor disposed over and electrically connected to the first doped region; and a bit line disposed over and electrically connected to the second doped region, wherein the bit line includes a conductive portion and an insulating portion surrounding the conductive portion, and the insulating portion includes ferroelectric material;

wherein the insulating portion further includes a void and a nitride layer surrounding the conductive portion.

14. The semiconductor structure of claim 13, wherein the ferroelectric material is disposed at a periphery of the bit line.

15. The semiconductor structure of claim 13, wherein a distance between the ferroelectric material and the capacitor is about 10 nm.

16. The semiconductor structure of claim 13, wherein the conductive material is surrounded by the ferroelectric material.

17. The semiconductor structure of claim 16, wherein a width of the conductive material is substantially greater than a width of the ferroelectric material.

18. The semiconductor structure of claim 13, further comprising a first dielectric layer disposed over the substrate and surrounding the transistor, and a second dielectric layer disposed over the first dielectric layer and surrounding the word line, the capacitor and the bit line.

19. The semiconductor structure of claim 18, wherein the ferroelectric material extends through the first dielectric layer or the second dielectric layer.

\* \* \* \* \*